(12) United States Patent
Shroff et al.

(10) Patent No.: US 8,536,006 B2
(45) Date of Patent: Sep. 17, 2013

(54) LOGIC AND NON-VOLATILE MEMORY (NVM) INTEGRATION

(75) Inventors: Mehul D. Shroff, Austin, TX (US); Mark D. Hall, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 119 days.

(21) Appl. No.: 13/307,719

(22) Filed: Nov. 30, 2011

(65) Prior Publication Data

US 2013/0137227 A1    May 30, 2013

(51) Int. Cl.
H01L 21/336    (2006.01)

(52) U.S. Cl.
USPC ............... 438/257; 438/258; 257/E21.61

(58) Field of Classification Search
USPC .... 438/201, 257, 258, 266, 593; 257/E21.61
See application file for complete search history.

(56) References Cited

U.S. PATENT DOCUMENTS

| | | | |
|---|---|---|---|
| 7,208,793 | B2 | 4/2007 | Bhattacharyya |
| 7,544,990 | B2 | 6/2009 | Bhattacharyya |
| 2008/0050875 | A1* | 2/2008 | Moon et al. .................. 438/257 |

OTHER PUBLICATIONS

Lee, J.J., et al, "Theoretical and Experimental Investigation of Si Nanocrystal Memory Device with HfO2 High-k Tunneling Dielectric", IEEE transactions on Electron Devices, vol. 50, No. 10, Oct. 2003, pp. 2067-2072.

Liu, Z., et al., "Metal Nanocrystal Memories—Part I: Device Design and Fabrication", IEEE Transactions on Electron Devices, vol. 49, No. 9, Sep. 2002, pp. 1606-1613.

Wang, X.P., et al., Dual Metal Gates with Band-Edge Work Functions on Novel HfLaO High-K Gate Dielectric, IEEE, Symposium on VLSI Technology Digest of Technical Papers, 2006.

U.S. Appl. No. 12/915,726, Shroff, M., et al, "Non-Volatile Memory and Logic Circuit Process Integration", filed Oct. 29, 2010.

U.S. Appl. No. 13/077,491, Shroff, M., et al, "Non-Volatile Memory and Logic Circuit Process Integration", filed Mar. 31, 2011.

U.S. Appl. No. 13/077,501, Shroff, M., et al, "Non-Volatile Memory and Logic Circuit Process Integration", filed Mar. 31, 2011.

* cited by examiner

*Primary Examiner* — Thanhha Pham
(74) *Attorney, Agent, or Firm* — James L. Clingan, Jr.; Joanna G. Chiu

(57) ABSTRACT

A method includes forming a gate dielectric over a substrate in an NVM region and a logic region; forming a first conductive layer over the gate dielectric in the NVM region and the logic region; patterning the first conductive layer in the NVM region to form a select gate; forming a charge storage layer over the select gate in the NVM region and the first conductive layer in the logic region; forming a second conductive layer over the charge storage layer in the NVM region and the logic region; removing the second conductive layer and the charge storage layer from the logic region; patterning the first conductive layer in the logic region to form a first logic gate; and after forming the first logic gate, patterning the second conductive layer in the NVM region to form a control gate which overlaps a sidewall of the select gate.

20 Claims, 6 Drawing Sheets

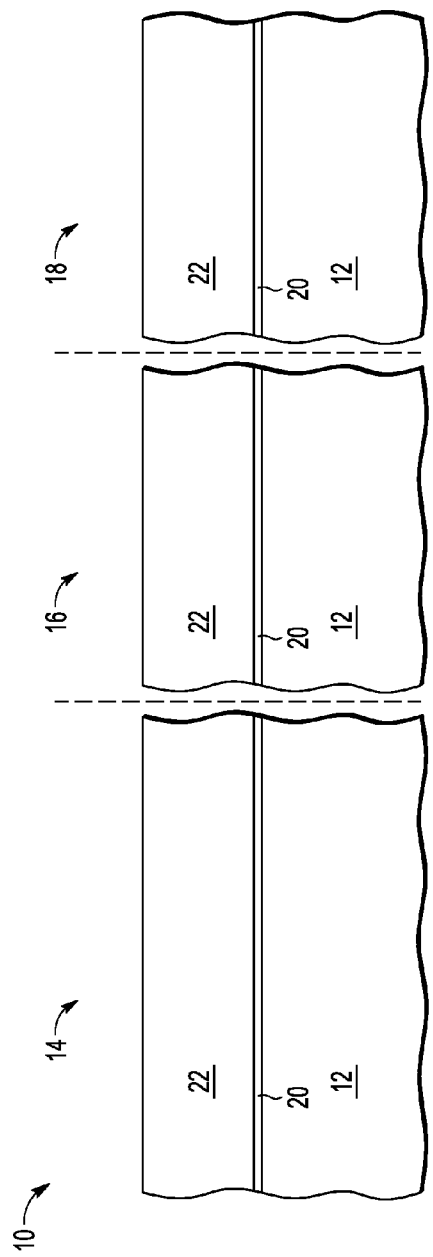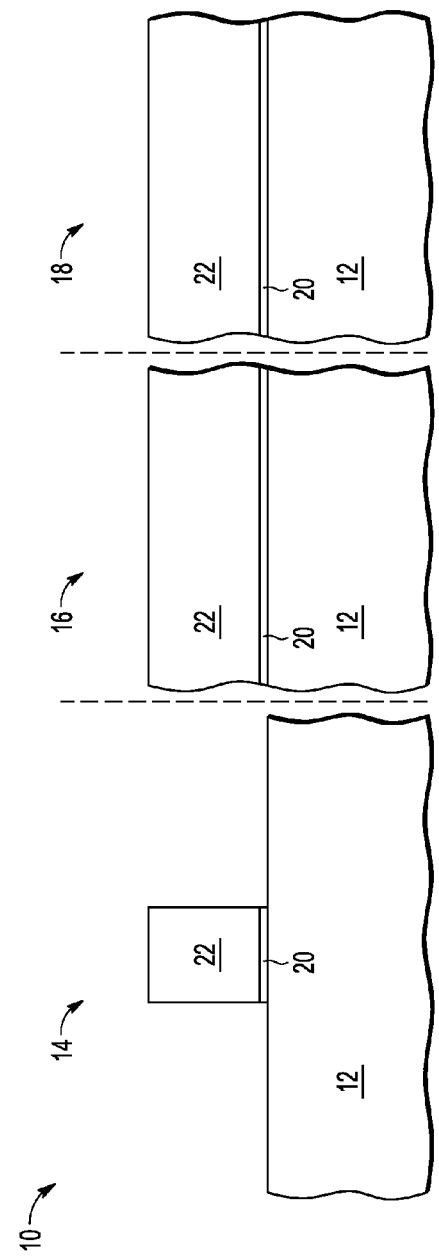

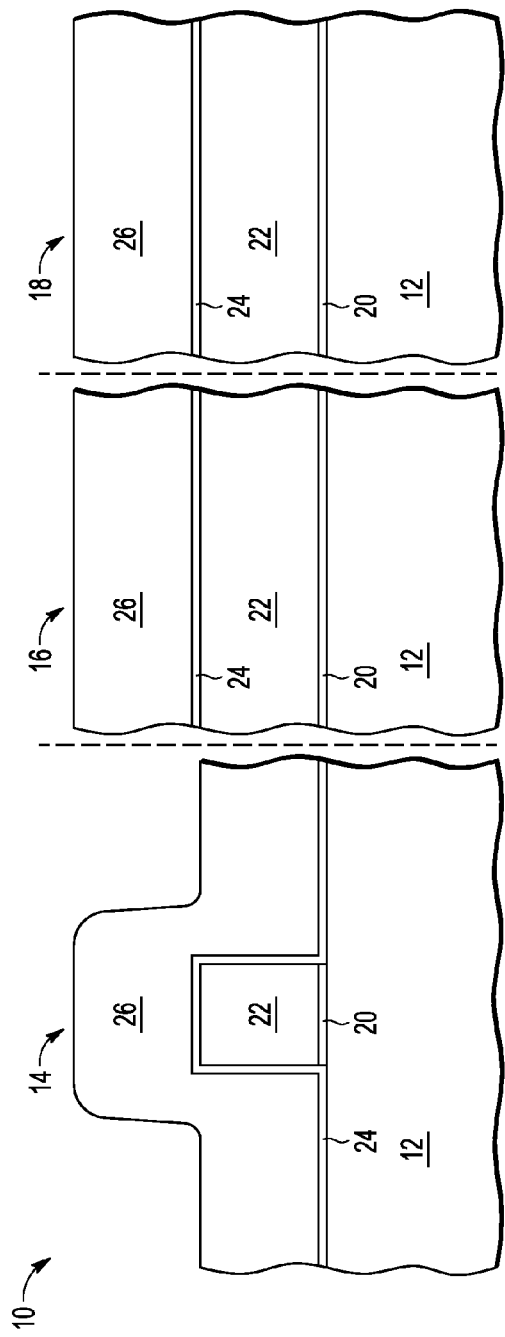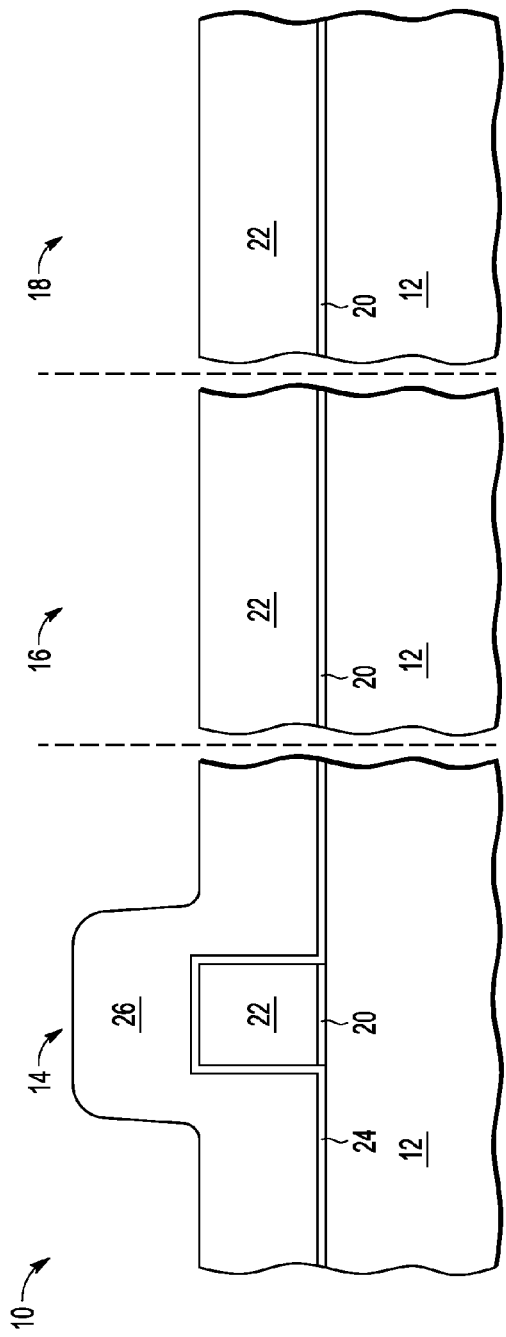

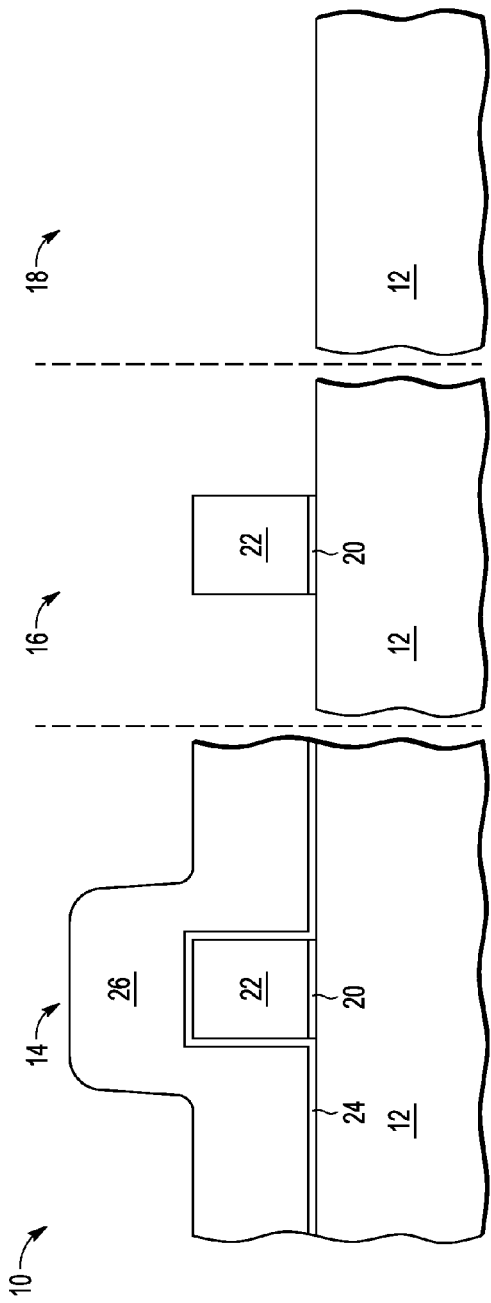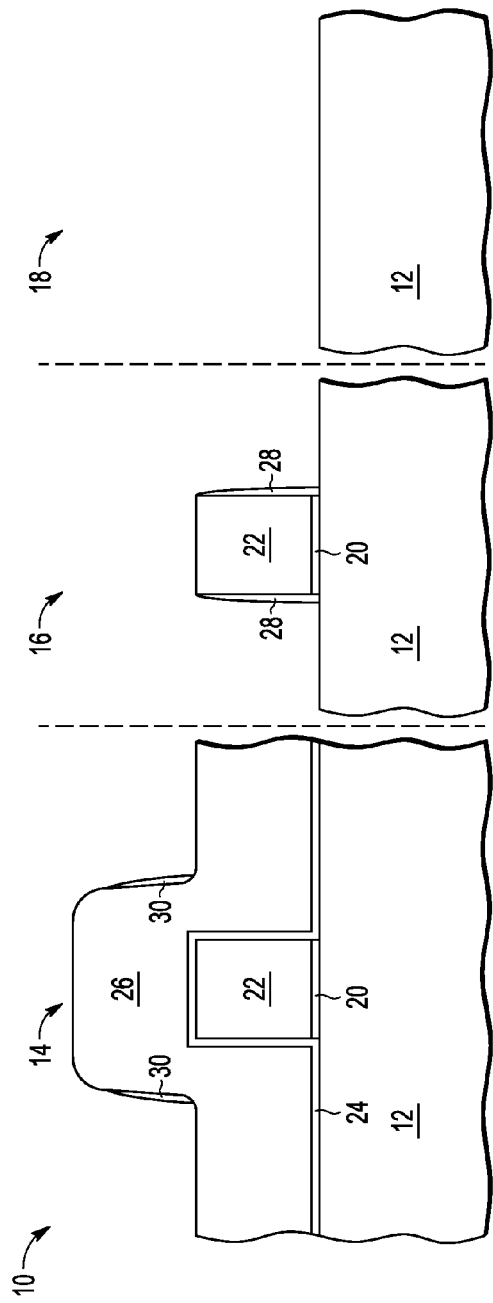

LOGIC AND NON-VOLATILE MEMORY (NVM) INTEGRATION

BACKGROUND

1. Field

The invention relates to non-volatile memories (NVMs), and more particularly, to NVMs integrated with logic devices.

2. Related Art

Non-volatile memories (NVMs) are often embedded in an integrated circuit which also performs other functions. In such cases it is undesirable to sacrifice logic performance in favor of performance of the NVM. Also it is important to avoid or minimize requiring additional cost in achieving high performance for both the logic and the NVM.

Accordingly there is a need to provide further improvement in achieving high performance while also addressing cost increase issues in integrated circuits that have both NVM and logic.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 1 is a cross section of a semiconductor device at a stage in processing according to an embodiment;

FIG. 2 is a cross section of the semiconductor device of FIG. 1 at a subsequent stage in processing;

FIG. 3 is a cross section of the semiconductor device of FIG. 2 at a subsequent stage in processing;

FIG. 4 is a cross section of the semiconductor device of FIG. 3 at a subsequent stage in processing;

FIG. 5 is a cross section of the semiconductor device of FIG. 4 at a subsequent stage in processing;

FIG. 6 is a cross section of the semiconductor device of FIG. 5 at a subsequent stage in processing;

DETAILED DESCRIPTION

Figure 7:
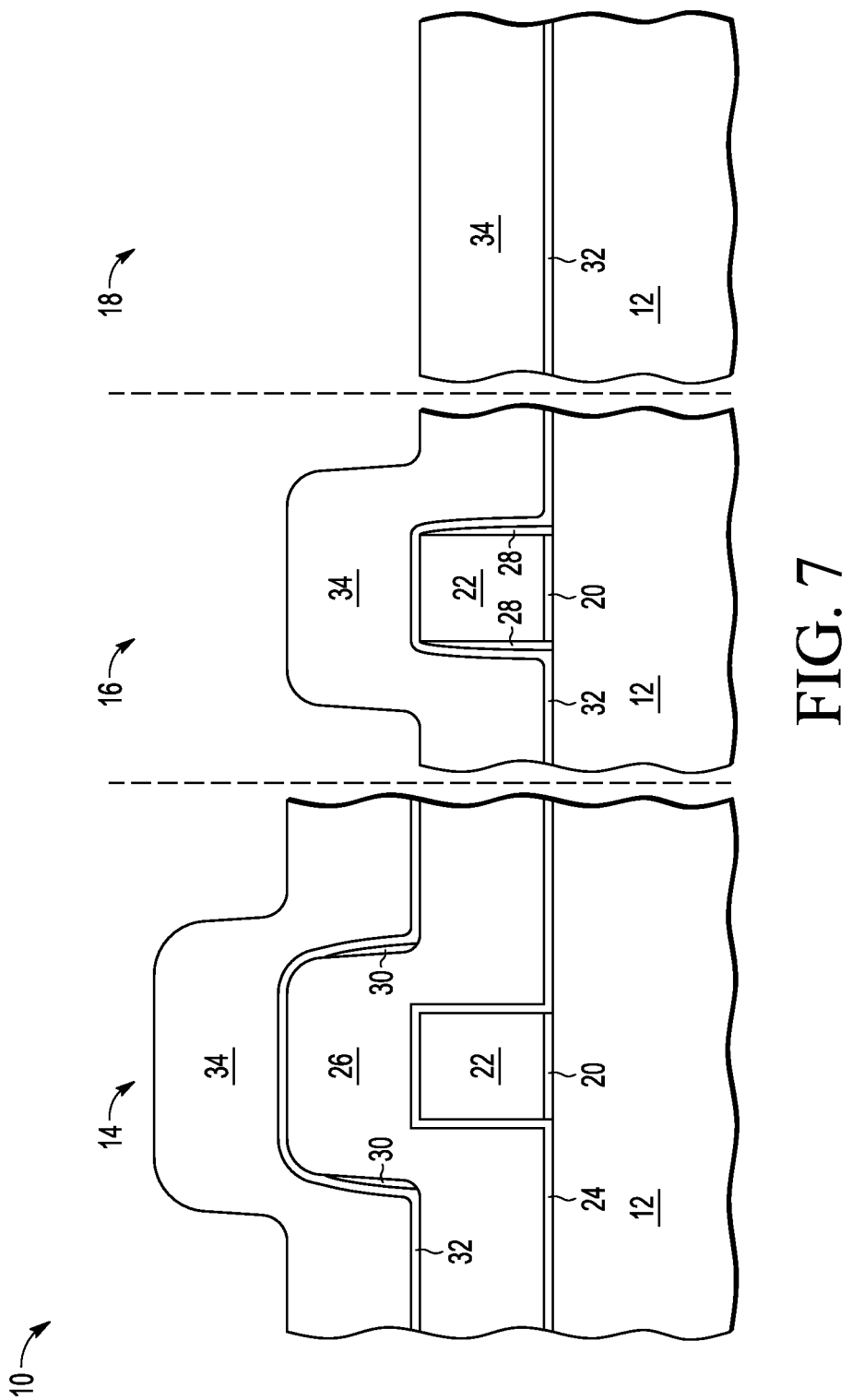
FIG. 7 is a cross section of the semiconductor device of FIG. 6 at a subsequent stage in processing.

A non-volatile memory (NVM) cell is made contemporaneously with both P-channel and N-channel logic transistors. This can be done with high-k gate dielectrics, metal gates, and metal nanocrystals. NVM cells are generally N-channel but there are situations where P-channel NVM cells may be better. Either way the metal gate for the select gate of the NVM cell is from the same metal deposition used for the transistors of the same doping type as the NVM cell and may be referenced as the first metal deposition. The metal layer for the control gate is deposited as the second metal layer. The second metal layer is removed from over the logic areas. The first metal in the area for the logic transistor that is the same doping type as the NVM cell is patterned and removed in the areas where the other transistor doping type is to be formed. A third metal deposition is performed for the metal of the gates for the other doping type of logic transistor. The third metal is patterned in the region of the other logic transistor doping type and removed from the areas of the NVM cell and the same logic transistor doping type as the NVM cell. The control gate is patterned to provide the gate structure for the NVM cell. This is better understood by reference to the drawings and the following written description.

Shown in FIG. 1 is a semiconductor device 10 having substrate 12, a gate dielectric 20, and gate stack 22. Semiconductor device 10 is divided into an NVM portion 14, an N-channel portion 16, and a P-channel portion 18. NVM portion 14 is for forming an NVM cell which, in this described example, is an N-channel NVM cell. N-channel portion 16 is for forming a transistor of the same doping type as the NVM cell and is referenced as an N-channel portion because the NVM cell being formed is N-channel. P-channel portion 18 is for forming a transistor of a different doping type from that of the NVM cell so is referenced as a P-channel portion. Gate dielectric 20 is formed by depositing a high-k dielectric such as hafnium oxide. Other examples of high-k dielectrics include lanthanum oxide, aluminum oxide, and tantalum oxide. Most commonly high-k dielectrics are oxides of a metal. Gate stack 22 is formed by depositing a metal on gate dielectric 20 that is chosen for its effectiveness in setting the work function for N-channel transistors. One such metal is tantalum carbide. Another example is lanthanum. An additional metal is then formed on the work-function-setting metal. Examples of the additional metal include aluminum, tungsten, tungsten nitride, and tantalum nitride. Many other metals may also be used and may depend on how easily they can be selectively etched. A further component of gate stack 22 is polysilicon that may be silicided. The silicidation may be, for example, cobalt silicide or nickel silicide. Although referenced as a gate stack, it may be feasible for gate stack 22 to be just one type of metal rather than a stack of different metal types.

Shown in FIG. 2 is semiconductor device 10 after patterning gate stack 22 in NVM portion 14. This leaves, in NVM portion 14, the select gate of the NVM cell being formed. Thus gate stack 22 in NVM portion 14 after the patterning shown in FIG. 2 may be referenced as select gate 22.

Shown in FIG. 3 is semiconductor device 10 after depositing a storage layer 24 that is for use as a charge storage layer for a control gate of the NVM cell being formed in NVM portion 14. The formation of storage layer 24 is also over gate stack 22 in N-channel portion 16 and P-channel portion 18. A metal layer 26 is deposited over storage layer 24. Metal layer 26 may be a stack of conductive layers including one or more metal layers or a single metal layer as for gate stack 22. Metal layer 26 is for use as a control gate of the NVM cell being formed in NVM portion 14. Charge storage layer 24 is preferably formed of a metal nanocrystals that are formed on a first high-k dielectric layer. A second high-k dielectric layer is formed over and between the metal nanocrystals. This is feasible because there is no exceptionally high heating step required before, during, or after formation of charge storage layer 24.

Shown in FIG. 4 is semiconductor device 10 after removing metal layer 26 and charge storage layer 24 in N-channel portion 16 and P-channel portion 18. Metal layer 26 and charge storage layer 24 remain in NVM portion 14 and are not etched into their control gate form during this etch in N-channel and P-channel portions 16 and 18, respectively.

Shown in FIG. 5 is semiconductor device 10 after pattern etching gate stack 22 into a logic gate in N-channel portion 16 and removing gate stack 22 from P-channel portion 18. Gate stack 22 after being etched as shown in FIG. 5 in N-channel portion 16 may be referenced as logic gate 22.

Shown in FIG. 6 is semiconductor device 10 after forming sidewall spacer 28 of nitride around logic gate 22. This is achieved by conformally depositing nitride and performing an anisotropic etch. This is done to provide slope to sidewalls of logic gate 22. As a result of the process, a sidewall spacer 30 may be formed also in NVM region 14 around an elevated portion of metal layer 26.

Shown in FIG. 7 is semiconductor device 10 after forming a high-k dielectric layer 32 in NVM region 14, N-channel region 16, and P-channel region 18. High-k dielectric layer 32 is then over metal layer 26 in NVM region 14, logic gate 22 and substrate 12 in N-channel region 16, and substrate 12 in P-channel region 18. A metal layer 34 is then deposited over high-k dielectric layer 32 in NVM region 14, N-channel region 16, and P-channel region 18. Metal layer 34 may be a stack similar to gate stack layer 22 except that the actual materials chose are for the gate of a P-channel transistor. For example, the first metal deposited is chosen for setting the work function of the P-channel transistor to be formed. One example of the work-function-setting material for a P-channel transistor is molybdenum. Another is titanium nitride. The second metal may be the same as for gate stack 22. Also a third layer may be polysilicon that is silicided. Unpatterned control gate 26 in NVM region 14 acts as a barrier between select gate 22, which in the present embodiment is N-type, and gate dielectric 32 along with P-type gate stack 34, thus preventing the formation of spacers of dielectric 32 and P-type gate stack 34 around select gate 22.

Figure 8:
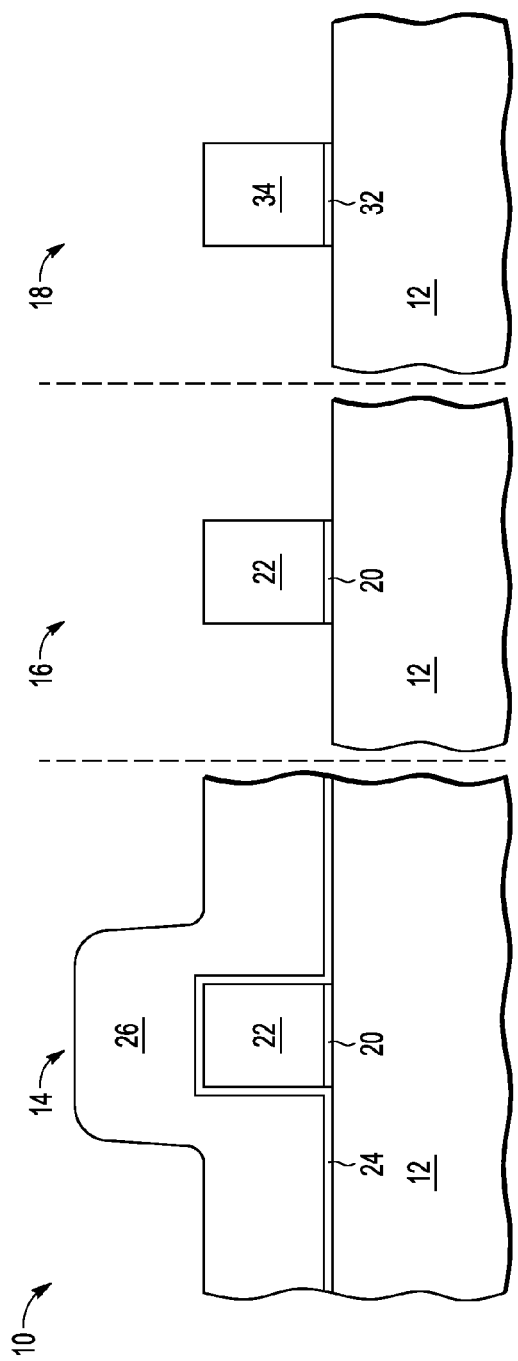
FIG. 8 is a cross section of the semiconductor device of FIG. 7 at a subsequent stage in processing.

Shown in FIG. 8 is semiconductor device 10 after pattern etching metal layer 34 in P-channel portion 18 and removing metal layer 34 from NVM portion 14 and N-channel portion 16. The result is that metal layer 34 as shown in P-channel portion 18 in FIG. 8 is a P-channel gate so that metal layer 34 as shown in FIG. 34 resulting from the etch may be referenced as P-channel gate 34. In the absence of sidewall spacer 28, the anisotropic etch of metal layer 34 in N-channel region 16 would result in a sidewall spacer along the sidewalls of N-channel gate 22 which would be difficult to remove by anisotropic etching. Isotropic etching would distort P-channel gate 34. High-k dielectric layer 32 is removed in NVM portion 14, N-channel portion 16 and an area not covered by P-channel gate 34 in P-channel portion 18. After the etch of high-k dielectric 32, spacers 28 and 30 are removed with an isotropic etch. Etchants of nitride are available that are highly selective to high-k dielectrics and metals that are likely candidates for use.

Figure 9:
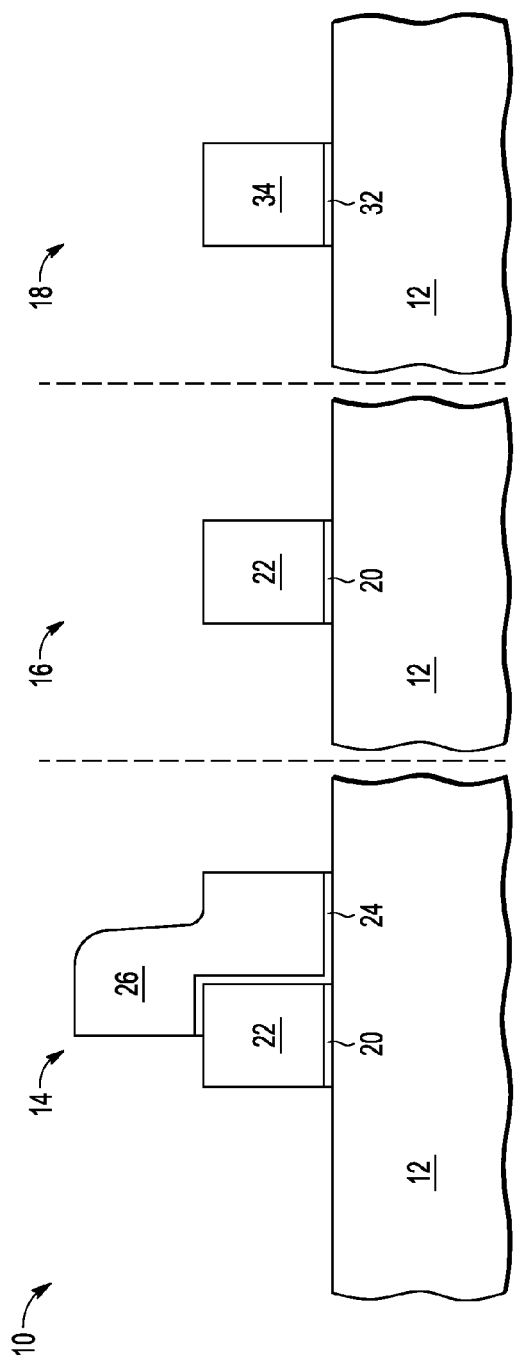
FIG. 9 is a cross section of the semiconductor device of FIG. 8 at a subsequent stage in processing.

Shown in FIG. 9 is semiconductor device 10 after performing a patterned etch of metal layer 26 and charge storage layer 24 in NVM portion 14 to form a control gate 26.

Figure 10:
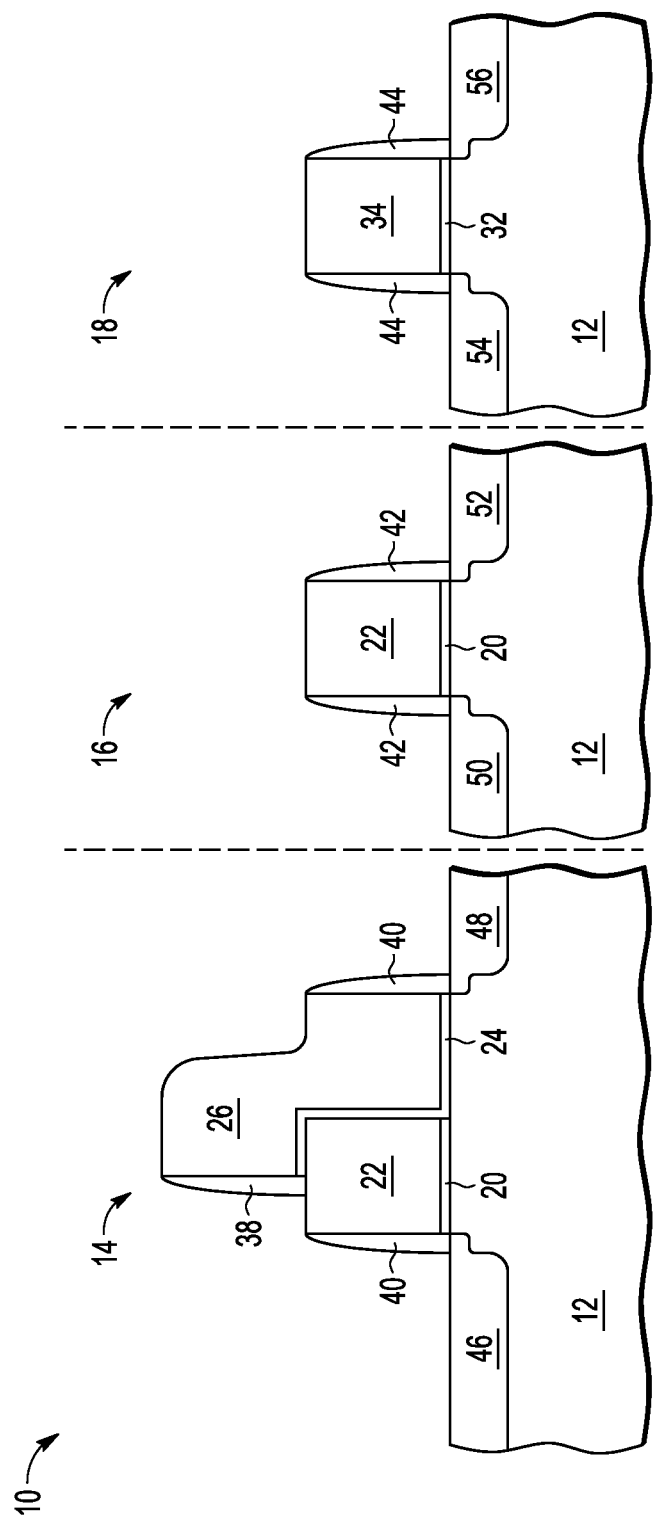
FIG. 10 is a cross section of the semiconductor device of FIG. 9 at a subsequent stage in processing.

Shown in FIG. 10 is semiconductor device 10 after forming sidewall spacer 38 on a side of an upper portion of control gate 26, a sidewall spacer 40 around the exposed sidewall of select gate 22 and lower portion of control gate 26, a sidewall spacer 42 around N-channel gate 22, a sidewall spacer 44 around P-channel gate 34, a source/drain 46 in substrate 12 substantially aligned to a sidewall of select gate 22, a source/drain 50 in substrate 12 substantially aligned to a first sidewall of N-channel gate 22, a source drain 52 in substrate 12 substantially aligned to a second sidewall of N-channel gate 22, a source/drain 48 in substrate 12 substantially aligned to a sidewall of a lower portion of control gate 26, a source/drain 54 in substrate 12 substantially aligned to a first sidewall of P-channel gate 34, a source drain 56 in substrate 12 substantially aligned to a second sidewall of P-channel gate 34. The result is an NVM memory cell in NVM portion 14, an N-channel transistor in N-channel portion 16, and a P-channel transistor in P-channel portion 18.

Thus it is seen an efficient manufacturing process for forming NVM cells and logic transistors that allows for high performance materials in both the NVM cell and the logic transistors. The high-k materials need not face exceptionally high temperatures that would threaten their integrity.

By now it should be appreciated that there has been provided a method of making a logic transistor in a logic region of a substrate and a non-volatile memory (NVM) cell in an NVM region of the substrate. The method includes forming a gate dielectric layer over the substrate in the NVM region and the logic region. The method further includes forming a first conductive layer over the gate dielectric layer in the NVM region and the logic region. The method further includes patterning the first conductive layer in the NVM region to form a select gate while maintaining the first conductive layer in the logic region. The method further includes forming a charge storage layer over the select gate in the NVM region and the first conductive layer in the logic region. The method further includes forming a second conductive layer over the charge storage layer in the NVM region and the logic region. The method further includes removing the second conductive layer and the charge storage layer from the logic region while maintaining the second conductive layer and the charge storage layer in the NVM region. The method further includes patterning the first conductive layer in the logic region to form a first logic gate. The method further includes after the patterning the first conductive layer in the logic region to form the first logic gate, patterning the second conductive layer and the charge storage layer in the NVM region to form a control gate which overlaps a first sidewall of the select gate. The method may further comprise forming a second gate dielectric layer over the second conductive layer in the NVM region and the first logic gate in the logic region. The method may further comprise, after the patterning the first conductive layer in the logic region to form the first logic gate and prior to the patterning the second conductive layer in the NVM region to form the control gate, forming a third conductive layer over the second gate dielectric layer in the NVM region and the logic region and patterning the third conductive layer to remove the third conductive layer and the second gate dielectric layer from the NVM region and to form a second logic gate in the logic region, wherein the first logic gate corresponds to a first transistor having a first conductivity type and the second logic gate corresponds to a second transistor having a second conductivity type, opposite from the first conductivity type. The method may further include forming source/drain regions in the substrate adjacent a second sidewall of the select gate and adjacent a sidewall of the control gate, forming source/drain regions in the substrate adjacent sidewalls of the first logic gate, and forming source/drain regions in the substrate adjacent sidewalls of the second logic gate. The method may further include forming source/drain regions in the substrate adjacent a second sidewall of the select gate and adjacent a sidewall of the control gate and forming source/drain regions in the substrate adjacent sidewalls of the first logic gate. The method may have a further characterization by which the step forming the gate dielectric layer comprises forming a high-k dielectric layer and the step of forming the first conductive layer comprises forming a first metal layer. The method may have a further characterization by which the step of forming the charge storage layer includes forming a bottom high-k dielectric layer over the select gate in the NVM region and the first conductive layer in the logic region, forming a plurality of nanocrystals over the bottom high-k dielectric layer in the NVM region and the logic region, and forming a top high-k dielectric layer over the plurality of nanocrystals in the NVM region and the logic region. The method may have a further characterization by which the step of forming the plurality of nanocrystals comprises forming a plurality of metal nanocrystals. The method may have a further characterization by which the step of patterning the first conductive layer in the NVM region to form a select gate while maintaining the first conductive layer in the logic region includes forming a patterned masking layer over the first conductive layer, wherein the patterned masking layer protects the first conductive layer in the logic region while forming the select gate. The method may have a further characterization by which wherein the step of removing the second conductive layer and the charge storage layer from the logic region while maintaining the second conductive layer and the charge storage layer in the NVM region includes forming a second patterned masking layer over the second conductive layer, wherein the second patterned masking layer exposes the second conductive layer in the logic region and protects the second conductive layer in the NVM region.

Also disclosed is a method of making a logic transistor in a logic region of a substrate and a non-volatile memory (NVM) cell in an NVM region of the substrate. The method includes forming a first metal layer over the gate dielectric layer in the NVM region and the logic region. The method further includes patterning the first metal layer in the NVM region to form a select gate while maintaining the first metal layer in the logic region. The method further includes forming a charge storage layer over the select gate in the NVM region and the first metal layer in the logic region, wherein the charge storage layer comprises a high-k dielectric material. The method further includes forming a charge storage layer over the select gate in the NVM region and the first metal layer in the logic region, wherein the charge storage layer comprises a high-k dielectric material. The method further includes forming a charge storage layer over the select gate in the NVM region and the first metal layer in the logic region, wherein the charge storage layer comprises a high-k dielectric material. The method further includes removing the second metal layer and the charge storage layer from the logic region but not from the NVM region. The method further includes patterning the first metal layer in the logic region to form a first logic gate. The method further includes after the patterning the first metal layer in the logic region to form the first logic gate, patterning the second metal layer and the charge storage layer in the NVM region to form a control gate which overlaps a first sidewall of the select gate. The method may have a further characterization by which after the patterning the first metal layer in the logic region to form the first logic gate and prior to the patterning the second metal layer in the NVM region to form the control gate the method further comprises forming a second gate dielectric layer over the second metal layer in the NVM region and the first logic gate in the logic region, forming a third metal layer over the second gate dielectric layer in the NVM region and the logic region, and patterning the third metal layer to remove the third conductive layer and the second gate dielectric layer from the NVM region and to form a second logic gate in the logic region, wherein the first logic gate corresponds to a first transistor having a first conductivity type and the second logic gate corresponds to a second transistor having a second conductivity type, opposite from the first conductivity type. The method may have a further characterization by which wherein the first conductivity type is further characterized as n-type and the second conductivity type is further characterized as p-type. The method may further include forming source/drain regions in the substrate adjacent a second sidewall of the select gate and adjacent a sidewall of the control gate, forming source/drain regions in the substrate adjacent sidewalls of the first logic gate, and forming source/drain regions in the substrate adjacent sidewalls of the second logic gate. The method may further include forming source/drain regions in the substrate adjacent a second sidewall of the select gate and adjacent a sidewall of the control gate and forming source/drain regions in the substrate adjacent sidewalls of the first logic gate. The method may have a further characterization by which the step forming the gate dielectric layer comprises forming a high-k dielectric layer. The method may have a further characterization by which wherein the step of forming the charge storage layer is further characterized in that the charge storage layer comprises a layer of metal nanocrystals surrounded by the high-k dielectric material. The method may have a further characterization by which the step of patterning the first metal layer in the NVM region to form the select gate while maintaining the first metal layer in the logic region includes forming a first patterned masking layer over the first metal layer, wherein the first patterned masking layer protects the first metal layer in the logic region while forming the select gate. The method may have a further characterization by which the step of removing the second metal layer and the charge storage layer from the logic region but not from the NVM region includes forming a second patterned masking layer over the second metal layer, wherein the second patterned masking layer exposes the second metal layer in the logic region and protects the second metal layer in the NVM region.

Disclosed also is a method of making a logic transistor in a logic region of a substrate and a non-volatile memory (NVM) cell in an NVM region of the substrate. The method includes forming a first high-k dielectric layer over the substrate in the NVM region and the logic region. The method further includes forming a first metal layer over the first high-k dielectric layer in the NVM region and the logic region. The method further includes patterning the first metal layer in the NVM region to form a select gate while maintaining the first metal layer in the logic region. The method further includes forming a charge storage layer over the select gate in the NVM region and the first conductive layer in the logic region, wherein forming the charge storage layer includes forming a bottom high-k dielectric layer over the select gate in the NVM region and the first metal layer in the logic region, forming a plurality of metal nanocrystals over the bottom high-k dielectric layer in the NVM region and the logic region, and forming a top high-k dielectric layer over the plurality of metal nanocrystals in the NVM region and the logic region. The method further includes forming a second metal layer over the charge storage layer in the NVM region and the logic region. The method further includes removing the second metal layer and the charge storage layer from the logic region but not from the NVM region. The method further includes patterning the first metal layer in the logic region to form a first logic gate. The method further includes forming a second high-k dielectric layer over the second metal layer in the NVM region and the first logic gate in the logic region. The method further includes forming a third metal layer over the second high-k dielectric layer in the NVM region and the logic region. The method further includes patterning the third metal layer to remove the third metal layer and the second high-k dielectric layer from the NVM region and to form a second logic gate in the logic region. The method further includes after forming the first logic gate and the second logic gate, patterning the second metal layer in the NVM region to form a control gate which overlaps a sidewall of the select gate. The method may further include forming an N-channel logic transistor using the first logic gate and forming a P-channel logic transistor using the second logic gate.

Although the invention is described herein with reference to specific embodiments, various modifications and changes can be made without departing from the scope of the present invention as set forth in the claims below. For example, N-channel transistors were described but, as an alternative, P-channel transistors can be formed first in P-channel portion 18. This approach, however, may add to much complexity due to the formation of additional spacers on the sidewalls of P-channel gate 34. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making a logic transistor in a logic region of a substrate and a non-volatile memory (NVM) cell in an NVM region of the substrate, comprising:
   forming a gate dielectric layer over the substrate in the NVM region and the logic region;
   forming a first conductive layer over the gate dielectric layer in the NVM region and the logic region;
   patterning the first conductive layer in the NVM region to form a select gate while maintaining the first conductive layer in the logic region;
   forming a charge storage layer over the select gate in the NVM region and the first conductive layer in the logic region;
   forming a second conductive layer over the charge storage layer in the NVM region and the logic region;
   removing the second conductive layer and the charge storage layer from the logic region while maintaining the second conductive layer and the charge storage layer in the NVM region;
   patterning the first conductive layer in the logic region to form a first logic gate; and
   after the patterning the first conductive layer in the logic region to form the first logic gate, patterning the second conductive layer and the charge storage layer in the NVM region to form a control gate which overlaps a first sidewall of the select gate.

2. The method of claim 1, wherein after the patterning the first conductive layer in the logic region to form the first logic gate and prior to the patterning the second conductive layer in the NVM region to form the control gate, the method further comprises:
   forming a second gate dielectric layer over the second conductive layer in the NVM region and the first logic gate in the logic region;
   forming a third conductive layer over the second gate dielectric layer in the NVM region and the logic region;
   patterning the third conductive layer to remove the third conductive layer and the second gate dielectric layer from the NVM region and to form a second logic gate in the logic region, wherein the first logic gate corresponds to a first transistor having a first conductivity type and the second logic gate corresponds to a second transistor having a second conductivity type, opposite from the first conductivity type.

3. The method of claim 2, further comprising:
   forming source/drain regions in the substrate adjacent a second sidewall of the select gate and adjacent a sidewall of the control gate;
   forming source/drain regions in the substrate adjacent sidewalls of the first logic gate; and
   forming source/drain regions in the substrate adjacent sidewalls of the second logic gate.

4. The method of claim 1, further comprising:
   forming source/drain regions in the substrate adjacent a second sidewall of the select gate and adjacent a sidewall of the control gate; and
   forming source/drain regions in the substrate adjacent sidewalls of the first logic gate.

5. The method of claim 1, wherein the step forming the gate dielectric layer comprises forming a high-k dielectric layer and the step of forming the first conductive layer comprises forming a first metal layer.

6. The method of claim 5, wherein the step of forming the charge storage layer comprises:
   forming a bottom high-k dielectric layer over the select gate in the NVM region and the first conductive layer in the logic region;
   forming a plurality of nanocrystals over the bottom high-k dielectric layer in the NVM region and the logic region; and
   forming a top high-k dielectric layer over the plurality of nanocrystals in the NVM region and the logic region.

7. The method of claim 6, wherein the step of forming the plurality of nanocrystals comprises forming a plurality of metal nanocrystals.

8. The method of claim 1, wherein the step of patterning the first conductive layer in the NVM region to form a select gate while maintaining the first conductive layer in the logic region comprises:
   forming a patterned masking layer over the first conductive layer, wherein the patterned masking layer protects the first conductive layer in the logic region while forming the select gate.

9. The method of claim 1, wherein the step of removing the second conductive layer and the charge storage layer from the logic region while maintaining the second conductive layer and the charge storage layer in the NVM region comprises:
   forming a second patterned masking layer over the second conductive layer, wherein the second patterned masking layer exposes the second conductive layer in the logic region and protects the second conductive layer in the NVM region.

10. A method of making a logic transistor in a logic region of a substrate and a non-volatile memory (NVM) cell in an NVM region of the substrate, comprising:
    forming a gate dielectric layer over the substrate in the NVM region and the logic region;
    forming a first metal layer over the gate dielectric layer in the NVM region and the logic region;
    patterning the first metal layer in the NVM region to form a select gate while maintaining the first metal layer in the logic region;

forming a charge storage layer over the select gate in the NVM region and the first metal layer in the logic region, wherein the charge storage layer comprises a high-k dielectric material;

forming a second metal layer over the charge storage layer in the NVM region and the logic region;

removing the second metal layer and the charge storage layer from the logic region but not from the NVM region;

patterning the first metal layer in the logic region to form a first logic gate; and after the patterning the first metal layer in the logic region to form the first logic gate, patterning the second metal layer and the charge storage layer in the NVM region to form a control gate which overlaps a first sidewall of the select gate.

11. The method of claim 10, wherein after the patterning the first metal layer in the logic region to form the first logic gate and prior to the patterning the second metal layer in the NVM region to form the control gate, the method further comprises:

forming a second gate dielectric layer over the second metal layer in the NVM region and the first logic gate in the logic region;

forming a third metal layer over the second gate dielectric layer in the NVM region and the logic region; and patterning the third metal layer to remove the third conductive layer and the second gate dielectric layer from the NVM region and to form a second logic gate in the logic region, wherein the first logic gate corresponds to a first transistor having a first conductivity type and the second logic gate corresponds to a second transistor having a second conductivity type, opposite from the first conductivity type.

12. The method of claim 11, wherein the first conductivity type is further characterized as n-type and the second conductivity type is further characterized as p-type.

13. The method of claim 11, further comprising:

forming source/drain regions in the substrate adjacent a second sidewall of the select gate and adjacent a sidewall of the control gate;

forming source/drain regions in the substrate adjacent sidewalls of the first logic gate; and forming source/drain regions in the substrate adjacent sidewalls of the second logic gate.

14. The method of claim 10, further comprising:

forming source/drain regions in the substrate adjacent a second sidewall of the select gate and adjacent a sidewall of the control gate; and forming source/drain regions in the substrate adjacent sidewalls of the first logic gate.

15. The method of claim 10, wherein the step forming the gate dielectric layer comprises forming a high-k dielectric layer.

16. The method of claim 10, wherein the step of forming the charge storage layer is further characterized in that the charge storage layer comprises a layer of metal nanocrystals surrounded by the high-k dielectric material.

17. The method of claim 10, wherein the step of patterning the first metal layer in the NVM region to form the select gate while maintaining the first metal layer in the logic region comprises:

forming a first patterned masking layer over the first metal layer, wherein the first patterned masking layer protects the first metal layer in the logic region while forming the select gate.

18. The method of claim 17, wherein the step of removing the second metal layer and the charge storage layer from the logic region but not from the NVM region comprises:

forming a second patterned masking layer over the second metal layer, wherein the second patterned masking layer exposes the second metal layer in the logic region and protects the second metal layer in the NVM region.

19. A method of making a logic transistor in a logic region of a substrate and a non-volatile memory (NVM) cell in an NVM region of the substrate, comprising:

forming a first high-k dielectric layer over the substrate in the NVM region and the logic region;

forming a first metal layer over the first high-k dielectric layer in the NVM region and the logic region;

patterning the first metal layer in the NVM region to form a select gate while maintaining the first metal layer in the logic region;

forming a charge storage layer over the select gate in the NVM region and the first conductive layer in the logic region, wherein forming the charge storage layer comprises:

forming a bottom high-k dielectric layer over the select gate in the NVM region and the first metal layer in the logic region;

forming a plurality of metal nanocrystals over the bottom high-k dielectric layer in the NVM region and the logic region; and forming a top high-k dielectric layer over the plurality of metal nanocrystals in the NVM region and the logic region;

forming a second metal layer over the charge storage layer in the NVM region and the logic region;

removing the second metal layer and the charge storage layer from the logic region but not from the NVM region;

patterning the first metal layer in the logic region to form a first logic gate;

forming a second high-k dielectric layer over the second metal layer in the NVM region and the first logic gate in the logic region;

forming a third metal layer over the second high-k dielectric layer in the NVM region and the logic region;

patterning the third metal layer to remove the third metal layer and the second high-k dielectric layer from the NVM region and to form a second logic gate in the logic region; and after forming the first logic gate and the second logic gate, patterning the second metal layer in the NVM region to form a control gate which overlaps a sidewall of the select gate.

20. The method of claim 19, further comprising:

forming an N-channel logic transistor using the first logic gate; and forming a P-channel logic transistor using the second logic gate.

* * * * *